United States Patent [19]
Wang et al.

[11] Patent Number: 5,629,237
[45] Date of Patent: May 13, 1997

[54] TAPER ETCHING WITHOUT RE-ENTRANCE PROFILE

[75] Inventors: Pei-Jan Wang; Kuei-Lung Chou; Jiunn-Jyi Lin; Hsien-Wen Chang, all of Hsin-Chu, Taiwan

[73] Assignee: Taiwan Semiconductor Manufacturing Company Ltd., Hsin-chu, Taiwan

[21] Appl. No.: 545,380

[22] Filed: Oct. 19, 1995

Related U.S. Application Data

[63] Continuation of Ser. No. 327,588, Oct. 24, 1994, abandoned.
[51] Int. Cl.$^6$ .................................................. H01L 21/311
[52] U.S. Cl. ........................... 438/701; 438/704; 438/640; 438/978
[58] Field of Search ...................... 437/195, 228, 437/947, 978, 981; 156/644.1, 653.1

[56] References Cited

U.S. PATENT DOCUMENTS

| | | | |
|---|---|---|---|
| 4,352,725 | 10/1982 | Tsukada | 156/643 |
| 4,372,034 | 2/1983 | Bohr | 437/947 |
| 4,902,377 | 2/1990 | Berglund et al. | 156/643 |
| 5,164,340 | 11/1992 | Chen et al. | 437/236 |
| 5,180,689 | 1/1993 | Liu et al. | 437/228 |
| 5,203,957 | 4/1993 | Yoo et al. | 156/643 |
| 5,219,791 | 6/1993 | Freiberger | 437/195 |

FOREIGN PATENT DOCUMENTS

| | | |
|---|---|---|
| 1-286442 | 11/1989 | Japan . |
| 2-2125 | 1/1990 | Japan .................................. 437/981 |
| 2-244720 | 9/1990 | Japan . |

OTHER PUBLICATIONS

Ghandhi, S.K., VLSI Fabrication Principles, 1983, John Wiley & Sons, pp. 493–494, 524.
Wolf, S., et al., Silicon Processing, 1986, vol. 1, Lattice Press, pp. 520–534, 539–555.

*Primary Examiner*—T. N. Quach
*Attorney, Agent, or Firm*—George O. Saile; Larry J. Prescott

[57] ABSTRACT

A method is described for forming tapered contact via holes in large scale integrated circuit structures which avoids the formation of a re-entrance profile. The re-entrance profile can form at the entrance to the contact via hole when a dry etch is used as a first etching step by redepositing material removed during the dry etch at the entrance of the contact via hole. This re-entrance profile makes the angle of entrance into the contact via hole greater than 90° and the step coverage of metal filling the hole poor. This invention uses wet etching with a greater lateral etch rate than vertical etch rate as a first etching step in the formation of the contact via hole and avoids the formation of the re-entrance profile. The edges of the resulting contact via hole are smooth and the entrance angle into the contact via hole is substantially less than 90°. The step coverage of metal later filling the contact via hole is substantially improved.

14 Claims, 5 Drawing Sheets

TAPER ETCHING WITHOUT RE-ENTRANCE PROFILE

RELATED PATENT APPLICATION

This patent application is a File Wrapper continuing application of Ser. No. 08/327,588, filed Oct. 24, 1994, now abandoned, entitled TAPER ETCHING WITHOUT RE-ENTRANCE PROFILE, by the same inventors.

BACKGROUND OF THE INVENTION

(1) Field of the Invention

The invention relates to the formation of tapered or beveled contact via holes which provide good step coverage when the contact via holes are filled with metal. The tapered or beveled contact via holes are formed using a wet etch as a first etching step thereby avoiding the formation of a re-entrance profile at the entrance of the contact via hole.

(2) Description of Related Art

High density integrated circuit technology requires the use of an insulating layer separating layers of metal electrode patterns formed over a semiconductor substrate containing device elements. Contact via holes must be formed in the insulating layer to form electrical connection to the contact areas in the semiconductor substrate. These contact via holes require good metal stepcoverage to insure reliable electrical contacts with low contact resistance. For high density circuits good metal stepcoverage requires a contact via hole opening with a bevel or taper.

The importance of beveled contact holes has been recognized for some time and many have worked on methods of achieving them. U.S. Pat. No. 5,180,689 to Liu et al shows the formation of tapered contact via holes by a combination of anisotropic and isotropic etch steps. Using a dry etching step as a first step in the formation of tapered contact via holes has the problem of the formation of a re-entrance profile due to redepositing etched material at the entrance of the contact via hole. We have fabricated tapered contact via holes using a dry etching step as the first step with results as shown in FIG. 1. Etched material is redeposited at the entrance to the contact via hole 50 forming a re-entrance profile 52 and making the angle of entrance 54 into the contact via hole greater than 90°. This makes it difficult to obtain good metal step coverage when the contact via hole is filled with metal. The current invention uses a wet etching step with a greater lateral etch rate than vertical etch rate as a first step in forming the tapered contact via hole. The wet etching prevents the formation of the re-entrance profile and provides an angle of entrance into the contact via hole of less than 90°.

U.S. Pat. No. 5,203,957 to Yoo et al uses argon sputter etching in the formation of contact via hole openings.

SUMMARY OF THE INVENTION

It is a principle objective of this invention to avoid the formation of a re-entrance profile when forming tapered contact via holes in large scale integrated circuit structures. Tapered contact via holes permit improved step coverage when the contact via holes are filled with metal. Formation of a re-entrance profile will seriously degrade step coverage.

This objective is achieved by means of wet etching with a greater lateral etch rate than vertical etch rate as a first step in the formation of the contact via hole. For a high-aspect ratio via hole the wet etching step is followed by a first dry vertical anisotropic etch, then a dry isotropic etch, and then a second dry vertical anisotropic etch. For a regular via hole the wet etching step is followed by a dry isotropic etch and then a dry vertical anisotropic etch. When the first etching step is a dry etch, insulating material removed from the contact via hole can be redeposited on the walls of the contact via hole. This redeposit forms a re-entrance profile 52 at the entrance to the contact via hole 50 as shown in FIG. 1. With the formation of the re-entrance profile the angle of entrance 54 into the contact via hole becomes greater than 90° and the step coverage of the metal which will eventually fill the contact via hole will be severely reduced. We have fabricated contact via holes using dry etching as a first etching step with results as shown in FIG. 1. Wet etching used as a first etching step in forming the contact via hole prevents the insulating material from redepositing and the re-entrance profile does not form. This keeps the angle of entrance 54 into the contact via hole less than 90°.

The invention can be used with high aspect ratio contact via holes as well as regular contact via holes. The invention can be used in N channel or P channel MOSFETs as well as other types of integrated circuit structures such as bipolar integrated circuits. The invention can be used for vias extending to contact areas in the semiconductor substrate as well as for contacts between layers of multilevel metal wiring layers.

DESCRIPTION OF THE PREFERRED EMBODIMENTS

The embodiments that follow describe the method for formation of tapered contact via holes which will later be filled with a metal conductor. The metal must have good step coverage to provide reliable, low resistance contacts. While the particular examples given are for an N channel MOSFET with a contact via hole extending from the top of the insulating layer to a contact area on the silicon substrate; the invention provides similar advantages for a P channel MOSFET, other types of integrated circuit structures such as bipolar integrated circuits, and for contacts between two levels of metal electrode patterns in an integrated circuit structure.

Figure 1:
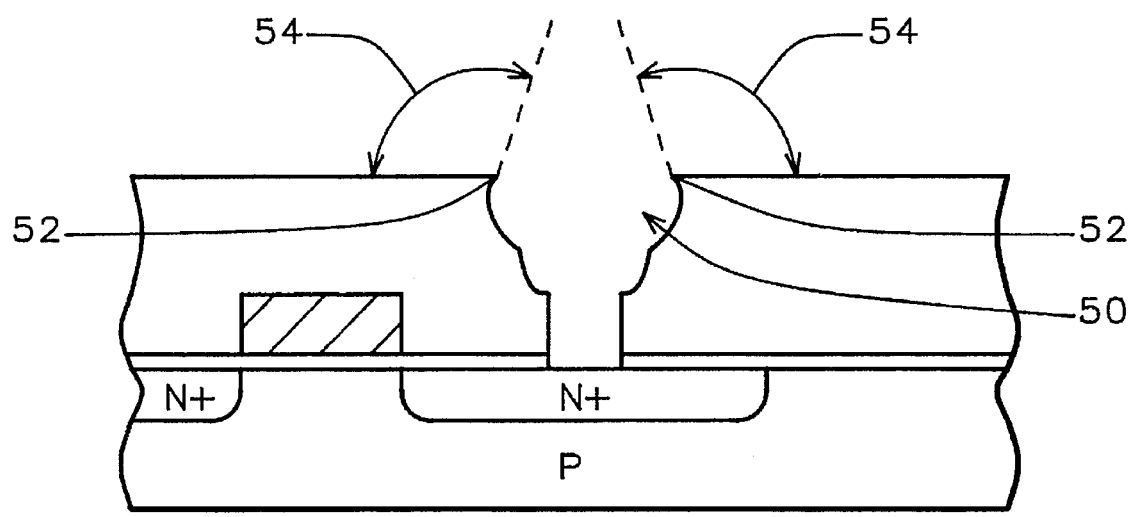
FIG. 1 is cross section view of a contact via hole with the re-entrance profile formed at the entrance to the contact via hole.

The embodiments which follow have a wet etch, with greater lateral etch than vertical etch, as a first step in the formation of the contact via hole. Previous methods of forming tapered contact via holes have used dry etching, either isotropic or anisotropic, as a first etching step. We have fabricated contact via holes using dry etching as a first etching step with results as shown in FIG. 1. A re-entrance profile 52 is formed at the entrance to the contact via hole 50. The re-entrance profile is formed because insulating material removed during the dry etching process can be redeposited at the entrance of the contact via hole. The entrance angle 54 to the contact via hole is greater than 90° and the step coverage of metal filling the via hole will be poor.

Figure 2:
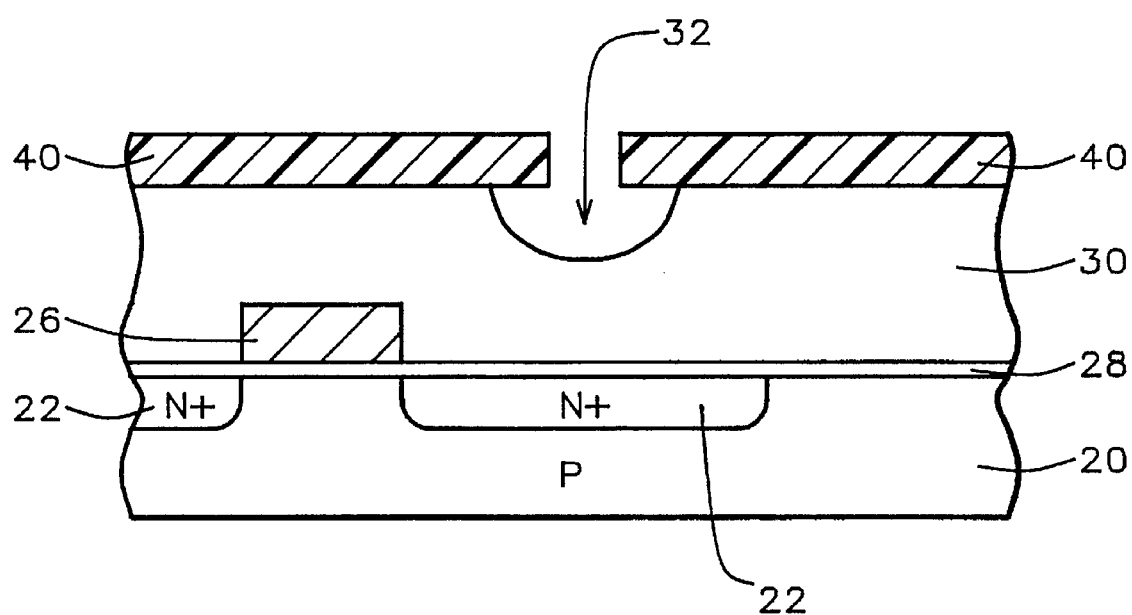
FIG. 2 is a cross section view of the integrated circuit structure after the wet etching, with greater lateral etch than vertical etch, used in formation of the high aspect ratio contact via hole.

Refer now to FIG. 2 through FIG. 6, there is shown an embodiment of a method of forming a tapered contact via hole with a high aspect ratio. FIG. 2 shows a cross section of a silicon substrate 20 with source/drain regions 22, a gate oxide layer 28, and a polysilicon gate electrode 26. An insulating layer 30, such as borophosphosilicate glass with a thickness between about 7500 and 9000 Angstroms, is formed over the surface of the silicon substrate and a photoresist masking layer 40 is formed over the insulating layer 30. A substantially circular opening with a diameter between about 0.7 and 1.0 microns is formed in the photoresist masking layer 40 using standard lithographic techniques. The opening in the photoresist masking layer is formed directly over the area of the silicon substrate where the contact via hole is to be formed, which in this example is the source/drain area.

Figure 3:
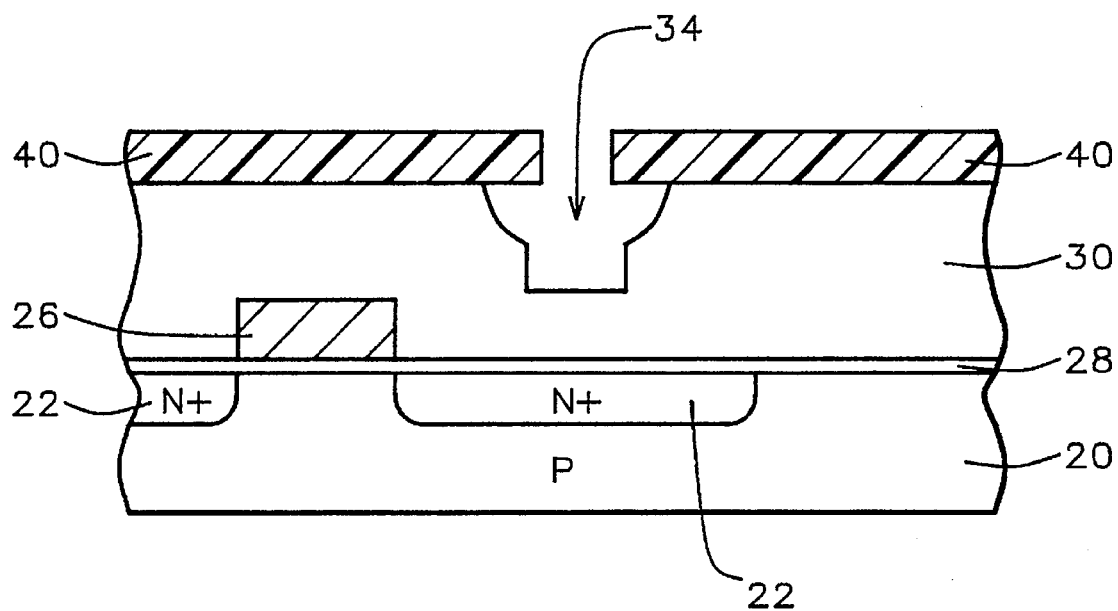
FIG. 3 is a cross section view of the integrated circuit structure after the first dry vertical anisotropic etch used in formation of the high aspect ratio contact via hole.
Figure 4:
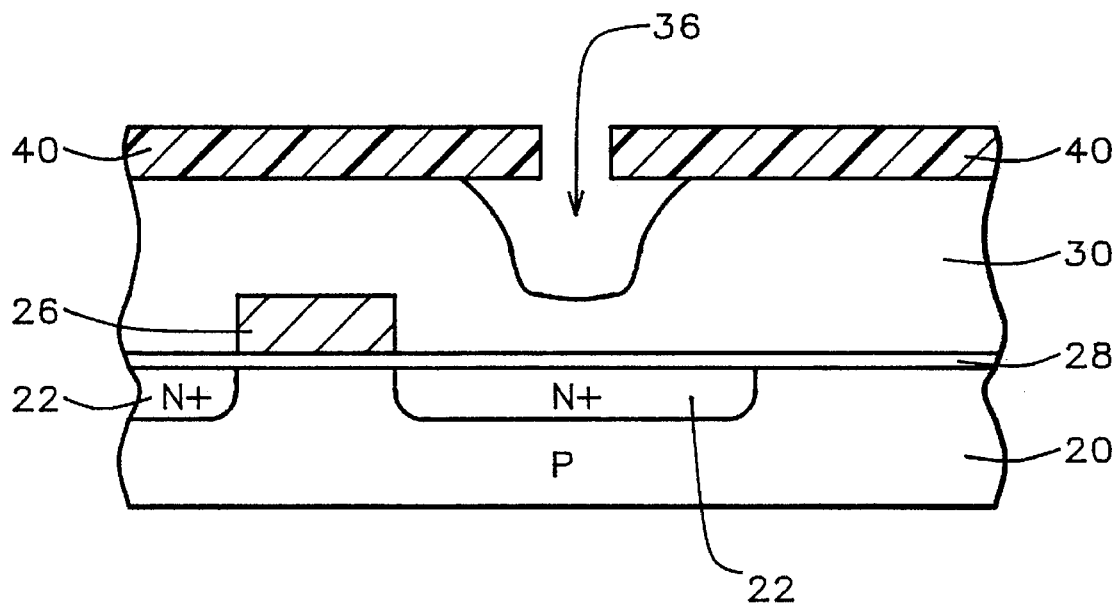
FIG. 4 is a cross section view of the integrated circuit structure after the dry isotropic etch used in formation of the high aspect ratio contact via hole.
Figure 5:
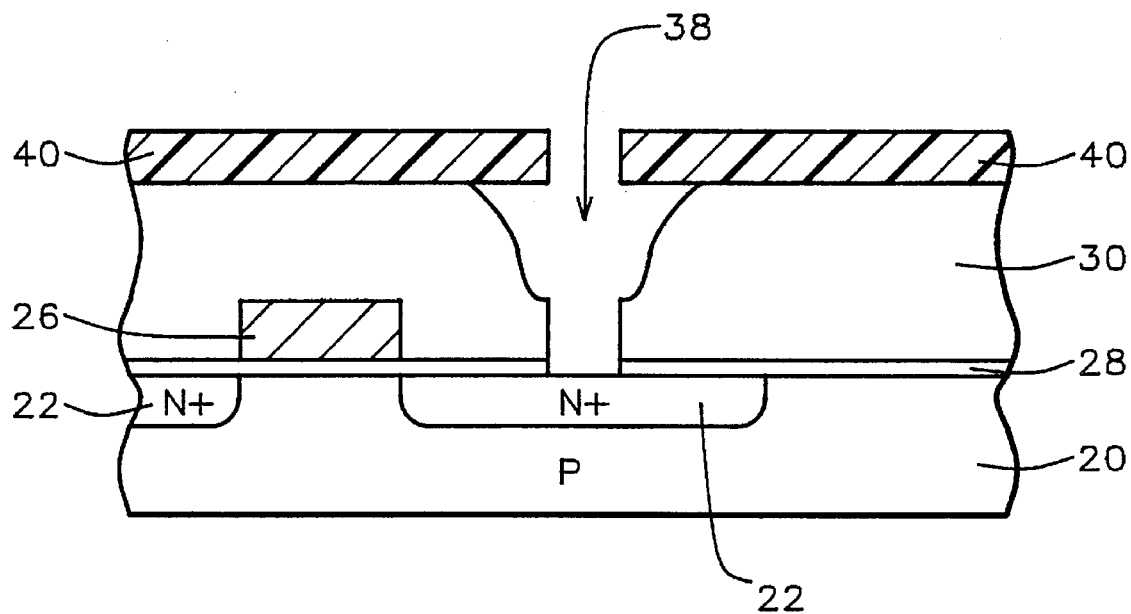
FIG. 5 is a cross section view of the integrated circuit structure after the second dry vertical anisotropic etch used in formation of the high aspect ratio contact via hole.

As shown in FIG. 2, a first via hole opening 32 is then formed in the insulating layer 30 by means of wet etching, with a greater lateral etch rate than vertical etch rate, using 10:1 buffered HF through the opening in the photoresist masking layer to a depth of between about 500 and 1000 Angstroms. Next, as shown in FIG. 3, the first via hole opening is extended to form a second via hole opening 34 in the insulating layer 30 by means of a first dry vertical anisotropic etching through the opening in the photoresist masking layer using ion bombardment with C.D. bias to an overall depth of between about 3000 and 4000 Angstroms. Next, as shown in FIG. 4, the second via hole opening is extended to form a third via hole opening in the insulating layer 30 by means of dry isotropic etching using plasma etching to an overall depth of between about 4000 and 5500 Angstroms. Next, as shown in FIG. 5, the third via hole opening is extended to form the contact via hole 38 by means of a second dry vertical anisotropic etch using ion bombardment with C.D. bias through the remaining depth of the insulating layer 30 and the gate oxide layer 28.

Figure 6:
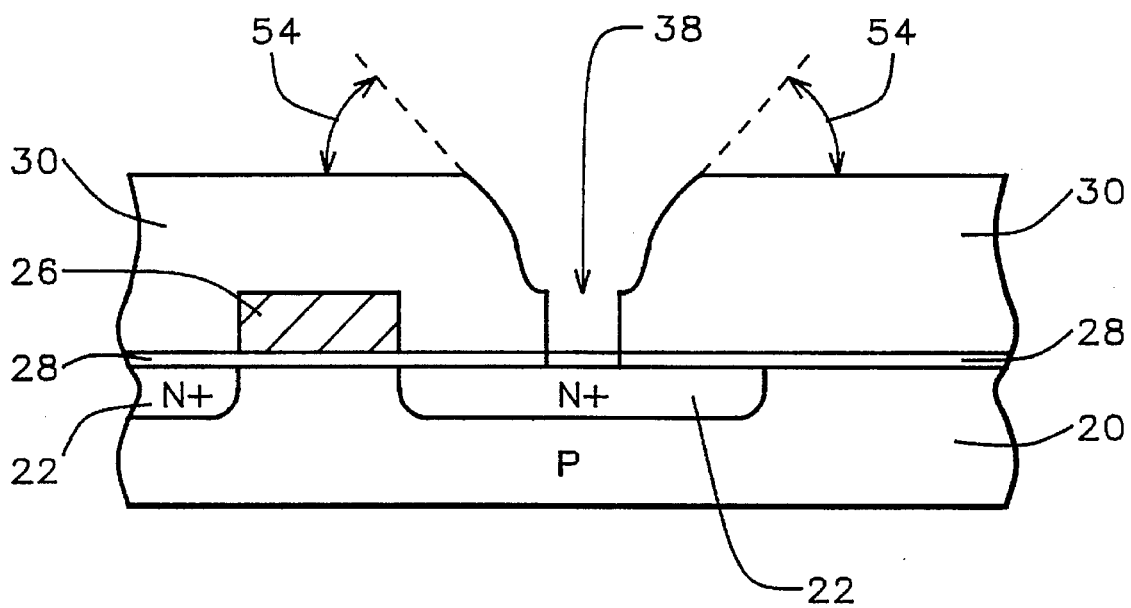
FIG. 6 is a cross section view of the integrated circuit structure after the high aspect ratio contact via hole has been formed and the photoresist masking layer has been removed.

Next, as shown in FIG. 6, the photoresist masking layer is removed and the formation of the contact via hole 38 is completed. In this case there is no re-entrance profile formed at the entrance to the contact via hole and the angle of entrance 54 into the contact via hole is substantially less than 90°. The contact via hole 38 has smooth edges and can be filled with metal with good step coverage.

Figure 7:
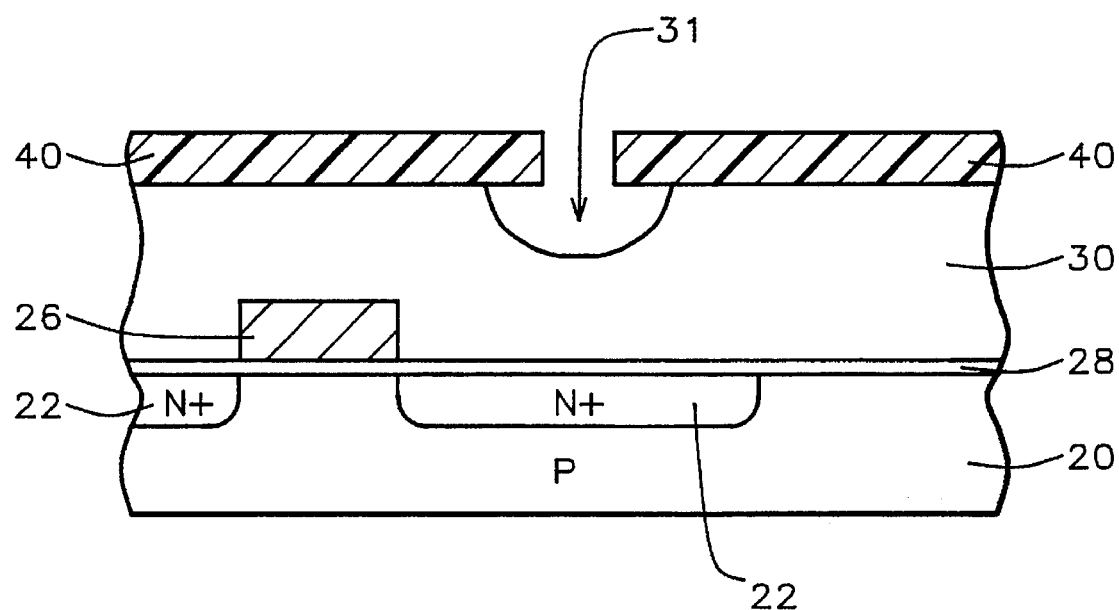
FIG. 7 is a cross section view of the integrated circuit structure after the wet etching with greater lateral etch than vertical etch used in formation of the regular contact via hole.

Refer now to FIG. 7 through FIG. 10, there is shown an embodiment of a method of forming a tapered contact via hole for a regular contact via hole. FIG. 7 shows a cross section of a silicon substrate 20 with source/drain regions 22, a gate oxide layer 28, and a polysilicon gate electrode 26. An insulating layer 30, such as borophosphosilicate glass with a thickness between about 5000 and 6000 Angstroms, is formed over the surface of the silicon substrate and a photoresist masking layer 40 is formed over the insulating layer 30. A substantially circular opening with a diameter between about 0.6 and 0.8 microns is formed in the photoresist masking layer using standard lithographic techniques. The opening in the photoresist masking layer is formed directly over the area of the silicon substrate where the contact via hole is to be formed, which in this example is the source/drain area.

Figure 8:
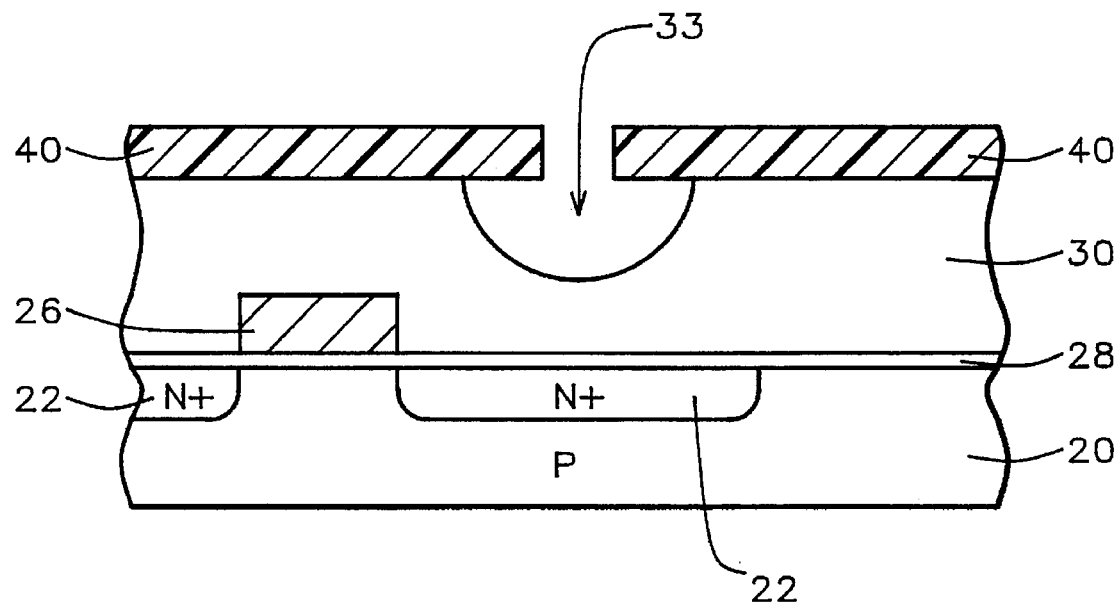
FIG. 8 is a cross section view of the integrated circuit structure after the dry isotropic etch used in formation of the regular contact via hole.
Figure 9:
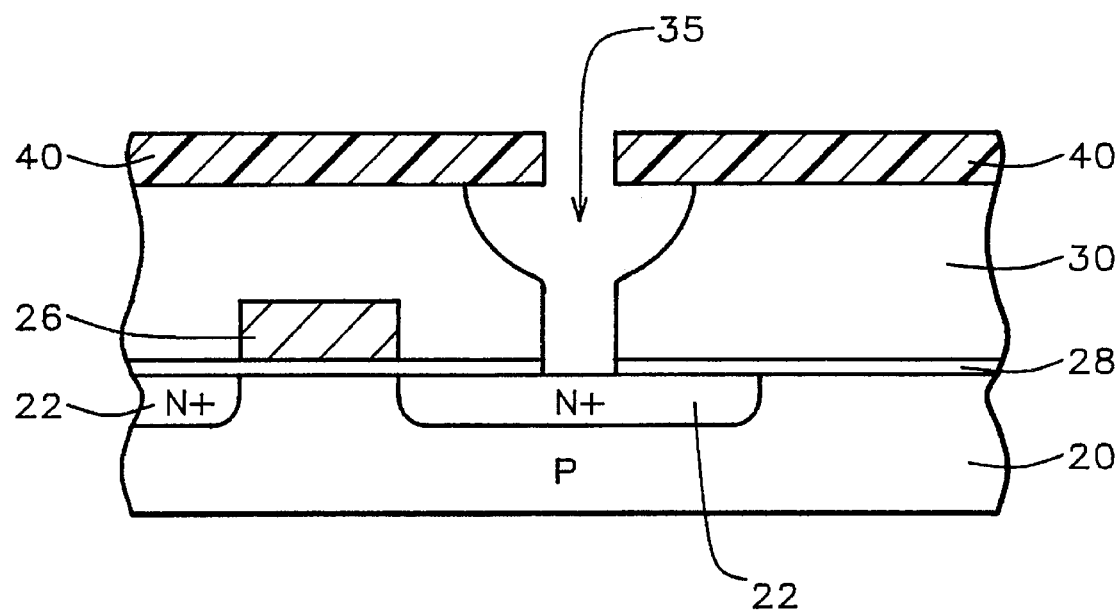
FIG. 9 is a cross section view of the integrated circuit structure after the dry vertical anisotropic etch used in formation of the regular contact via hole.

As shown in FIG. 7, a first via hole opening 31 is then formed in the insulating layer 30 by means of wet etching, with a greater lateral etch rate than vertical etch rate, using 10:1 buffered HF through the opening in the photoresist masking layer to a depth of between about 500 and 1000 Angstroms. Next, as shown in FIG. 8, the first via hole opening is extended to form a second via hole opening 33 in the insulating layer 30 by means of dry isotropic etching through the opening in the photoresist masking layer using plasma etching to an overall depth of between about 2500 and 3000 Angstroms. Next, as shown in FIG. 9, the second via hole opening is extended to form the contact via hole 35 by means of a dry vertical anisotropic etch using ion bombardment with C.D. bias through the remaining depth of the insulating layer 30 and the gate oxide layer 28.

Figure 10:
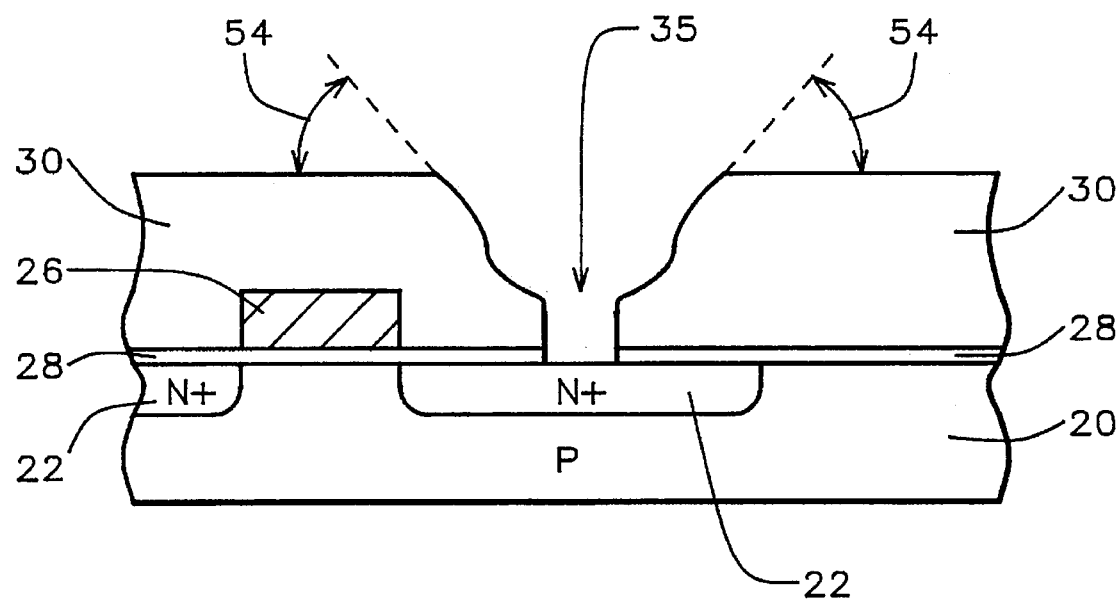
FIG. 10 is a cross section view of the integrated circuit structure after the regular contact via hole has been formed and the photoresist masking layer has been removed.

Next, as shown in FIG. 10, the photoresist masking layer is removed and the formation of the contact via hole is completed. In this case there is no re-entrance profile formed at the entrance to the contact via hole 35 and the angle of entrance 54 into the contact via hole is substantially less than 90°. The contact via hole 35 has smooth edges and can be filled with metal with good step coverage.

While the invention has been particularly shown and described with reference to the preferred embodiments thereof, it will be understood by those skilled in the art that various changes in form and details may be made without departing from the spirit and scope of the invention.

What is claimed is:

1. A method of forming tapered contact via holes, comprising the steps of:

providing an integrated circuit structure having device elements within a semiconductor substrate, contact areas in said semiconductor substrate, and an insulating layer over said semiconductor substrate;

forming a photoresist masking layer over said insulating layer;

forming openings in said photoresist masking layer directly over said contact areas;

wet etching into said insulating layer through a first thickness, thereby forming a first via hole opening, using said photoresist masking layer as a mask;

vertically anisotropically etching, by means of a first dry anisotropic etch, into said insulating layer through a second thickness, thereby forming a second via hole opening, using said photoresist masking layer as a mask;

isotropically etching, by means of a dry isotropic etch, into said insulating layer through a third thickness, thereby forming a third via hole opening, using said photoresist masking layer as a mask;

vertically anisotropically etching, by means of a second dry anisotropic etch, through the remainder of said insulating layer, thereby forming said tapered contact via hole opening, using said photoresist masking layer as a mask; and removing said photoresist masking layer.

2. The method of claim 1 wherein said insulating layer is borophosphosilicate glass with a thickness of between about 7500 and 9000 Angstroms.

3. The method of claim 1 wherein said opening in said photoresist masking layer is circular with a diameter of between about 0.7 and 1.0 microns.

4. The method of claim 1 wherein said first dry anisotropic etch is accomplished by means of ion bombardment.

5. The method of claim 1 wherein said dry isotropic etch is accomplished by means of plasma etching.

6. The method of claim 1 wherein said second dry anisotropic etch is accomplished by means of ion bombardment.

7. The method of claim 1 wherein said first thickness is between about 500 and 1000 Angstroms.

8. The method of claim 1 wherein said second thickness is between about 2500 and 3000 Angstroms.

9. The method of claim 1 wherein said third thickness is between about 1000 and 1500 Angstroms.

10. The method of claim 1 wherein said insulating layer is silicon dioxide with a thickness of between about 7500 and 9000 Angstroms.

11. The method of claim 1 wherein said insulating layer is glass with a thickness of between about 7500 and 9000 Angstroms.

12. A method of forming tapered contact via holes, comprising the steps of:

providing an integrated circuit structure having device elements within a semiconductor substrate, contact areas in said semiconductor substrate, and a layer of borophosphosilicate glass having a thickness of between about 5000 and 9000 Angstroms over said semiconductor substrate;

forming a photoresist masking layer over said layer of borophosphosilicate glass;

forming openings in said photoresist masking layer directly over said contact areas;

wet etching into said layer of borophosphosilicate glass through a first thickness, thereby forming a first via hole opening, using said photoresist masking layer as a mask;

isotropically etching, by means of a dry isotropic etch, into said layer of borophosphosilicate glass through a second thickness, thereby forming a second via hole opening, using said photoresist masking layer as a mask;

vertically anisotropically etching, by means of a dry anisotropic etch, through the remainder of said layer of borophosphosilicate glass, thereby forming said tapered contact via hole opening, using said photoresist masking layer as a mask; and removing said photoresist masking layer.

13. A method of forming tapered contact via holes, comprising the steps of:

providing an integrated circuit structure having device elements within a semiconductor substrate, contact areas in said semiconductor substrate, and a layer of silicon dioxide having a thickness of between about 7500 and 9000 Angstroms over said semiconductor substrate;

forming a photoresist masking layer over said layer of silicon dioxide;

forming openings in said photoresist masking layer directly over said contact areas;

wet etching into said layer of silicon dioxide through a first thickness, thereby forming a first via hole opening, using said photoresist masking layer as a mask;

isotropically etching, by means of a dry isotropic etch, into said layer of silicon dioxide through a second thickness, thereby forming a second via hole opening, using said photoresist masking layer as a mask;

vertically anisotropically etching, by means of a dry anisotropic etch, through the remainder of said layer of silicon dioxide, thereby forming said tapered contact via hole opening, using said photoresist masking layer as a mask; and removing said photoresist masking layer.

14. A method of forming tapered contact via holes, comprising the steps of:

providing an integrated circuit structure having device elements within a semiconductor substrate, contact areas in said semiconductor substrate, and a layer of glass having a thickness of between about 7500 and 9000 Angstroms over said semiconductor substrate;

forming a photoresist masking layer over said layer of glass;

forming openings in said photoresist masking layer directly over said contact areas;

wet etching into said layer of glass through a first thickness, thereby forming a first via hole opening, using said photoresist masking layer as a mask;

isotropically etching, by means of a dry isotropic etch, into said layer of glass through a second thickness, thereby forming a second via hole opening, using said photoresist masking layer as a mask;

vertically anisotropically etching, by means of a dry anisotropic etch, through the remainder of said layer of glass, thereby forming said tapered contact via hole opening, using said photoresist masking layer as a mask; and removing said photoresist masking layer.

* * * * *